United States Patent [19]
Jackoski et al.

[11] Patent Number: 5,844,448
[45] Date of Patent: Dec. 1, 1998

[54] METHOD AND APPARATUS FOR OPTIMIZING AN OSCILLATOR START UP TIME

[75] Inventors: Keith Edward Jackoski, Wellington; John Wayne Simmons, Tamarac; Gerald Paul Schwieterman, Lake Worth, all of Fla.

[73] Assignee: Motorola, Inc., Schaumburg, Ill.

[21] Appl. No.: 928,162

[22] Filed: Sep. 12, 1997

[51] Int. Cl.$^6$ .............................. H03B 5/32; H03L 3/00
[52] U.S. Cl. ...................... 331/158; 331/177 V; 331/179
[58] Field of Search .................... 331/116 R, 116 FE, 331/158, 177 R, 177 V, 179

[56] References Cited

U.S. PATENT DOCUMENTS

| | | | |
|---|---|---|---|
| 4,896,122 | 1/1990 | Tahernia et al. | 331/158 |
| 5,030,926 | 7/1991 | Walden | 331/116 FE |
| 5,349,309 | 9/1994 | Fujii | 331/17 |
| 5,493,715 | 2/1996 | Humphreys et al. | 331/177 V |
| 5,534,826 | 7/1996 | Logan | 331/158 |

OTHER PUBLICATIONS

Andreas Rusznyak, "Start–Up Time of CMOS Oscillators", 1987 IEEE Transactions on Circuits and Systems, vol. CAS–34, No. 3, Mar. 1987, pp. 259–268.

*Primary Examiner*—Siegfried H. Grimm
*Attorney, Agent, or Firm*—Pablo Meles

[57] ABSTRACT

An oscillator circuit (10) having an optimized start up time includes an inverting amplifier (12) coupled in parallel to a crystal (14), a first bank of capacitors (16) coupled to the crystal, and a second bank of capacitors (20) switchably coupled (18) in parallel to the frequency resonant network, wherein the second bank of capacitors has a higher capacitance load than the first bank of capacitors. The oscillator circuit may also include a processor (62) for controlling when the second bank of capacitors gets switched and coupled to the crystal.

18 Claims, 4 Drawing Sheets

METHOD AND APPARATUS FOR OPTIMIZING AN OSCILLATOR START UP TIME

FIELD OF THE INVENTION

This invention relates in general to selective call communication devices and more specifically to an oscillator circuit having a fast start up time for use in a selective call communication device.

BACKGROUND OF THE INVENTION

Crystal controlled oscillators are widely used in communication receivers to establish the operating frequency or channel on which the communication receiver is to operate. Crystal controlled oscillators have in the past been designed to provide rapid start-up times, such as required in a communication receiver having battery saver features. Such crystal controlled oscillators were generally operated at relatively high current drains, which were required to insure rapid oscillator start-up times so that the communication receiver would be capable of receiving transmitted information in relatively short periods of time. As a result, the current drain of the oscillator circuit was typically a significant portion of the communication receiver current drain, in some instance being as much as one-third of the receiver-on current drain. The ultimate battery life provided in the prior art communication receiver was primarily determined by the receiver-on current drain, and as indicated this was highly influenced by the requirement of high operating currents to insure crystal oscillator start-up in a minimum amount of time.

Synthesized communication receivers also utilized crystal controlled oscillators to provide the reference frequency for the frequency synthesizer. The time required for the receiver to receive transmitted information was determined both by the time required to effect reference oscillator start-up and the time required to stabilize the frequency synthesizer output. In order to achieve rapid frequency synthesizer start-up times, the reference oscillator start-up time had to be minimized, generally at the expense of increased current drain of the crystal oscillator. The ultimate battery life provided in a synthesized communication receiver was consequently determined not only by the receiver current drain, as in a non-synthesized communication receiver, but also by the synthesizer current drain and the increased current drain added for reference oscillator start-up.

A typical prior art crystal controlled oscillator when implemented using CMOS integrated circuit technology forms a CMOS Pierce oscillator which is described in U.S. Pat. No. 3,676,801 to Musa which is assigned to the assignee of the present invention. While such an oscillator is suitable as a reference oscillator for microprocessors and microcomputers, the problem of slow start-up times, unless operated at high current levels, limits the use as a reference oscillator in a synthesized communication receiver employing battery saving techniques, unless high current drains are utilized to provide the necessary rapid oscillator start-up times. U.S. Pat. No. 4,896,122 assigned to the assignee of the present invention, describes an oscillator circuit that uses a first transconductance amplifier providing sufficient gain to maintain oscillation with an oscillator crystal with a minimum current drain which further uses a second transconductance amplifier that selectively couples to the first transconductance amplifier to augment the gain of the first transconductance amplifier to provide the capability for rapid oscillator start-up following battery saver operations.

Thus, a need exists for an oscillator circuit that overcomes the problems described above and which significantly improves current drain over existing circuits.

SUMMARY OF THE INVENTION

In a first aspect of the present invention, a method of optimizing an oscillator start up time comprises the steps of applying a minimum capacitance load to an oscillator circuit, sensing a stable oscillator output at a first frequency and applying a second capacitance load when the stable oscillator output at the first frequency is sensed to provide a desired oscillation frequency.

In a second aspect of the present invention, an oscillator circuit having an optimized start up time comprises an inverting amplifier coupled in parallel to a frequency resonant network, a first bank of capacitors coupled to the frequency resonant network, and a second bank of capacitors switchably coupled in parallel to the frequency resonant network, wherein the second bank of capacitors has a higher capacitance load than the first bank of capacitors.

In yet another aspect of the present invention, a selective call device comprises a receiver having an oscillator circuit and a decoder and a processor coupled to the oscillator. The processor is preferably programmed to optimize the start up time of the oscillator circuit by applying a minimum capacitance load to the oscillator circuit, sensing a stable output oscillating at a prescribed frequency, and applying a second capacitance load to provide a desired frequency tuning point.

DETAILED DESCRIPTION

Figure 1:
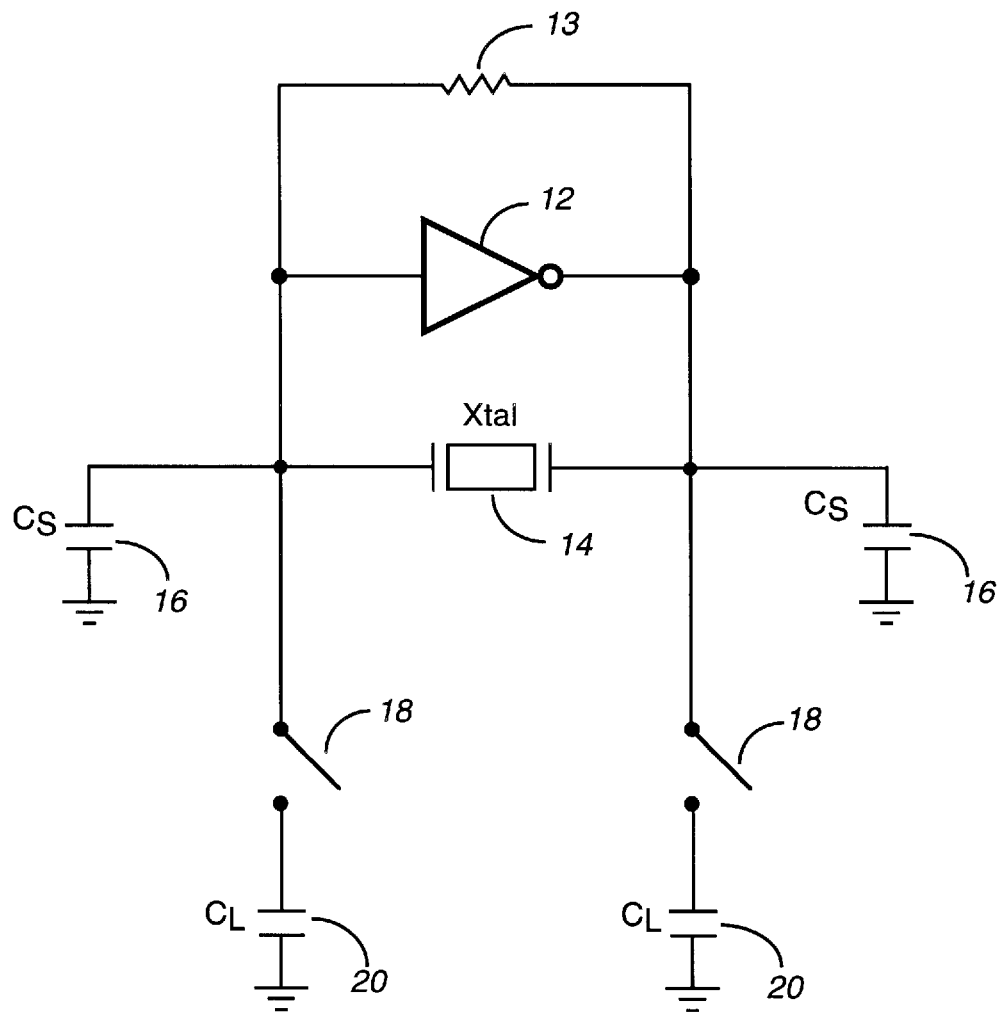
FIG. 1 is block diagram of an oscillator circuit in accordance with the present invention.

Referring to FIG. 1, an oscillator circuit 10 having an optimized start up time is shown in accordance with the present invention. Preferably, the oscillator circuit 10 comprises an inverting amplifier 12 (or transconductance amplifier) coupled in parallel to a frequency resonant network 14. The frequency resonant network 14 is preferably a crystal, but could also be a ceramic resonator or an inductor-capacitor equivalent circuit. The oscillator circuit 10 further comprises a first bank of capacitors 16 coupled to the frequency resonant network 14 and a second bank of capacitors 20 switchably coupled in parallel to the frequency resonant network 14. The second bank of capacitors preferably has a higher capacitance load than the first bank of capacitors. The second bank of capacitors can be switched in using the switches 18 as shown. Resistor 13 is used to bias up the amplifier and complete the DC feedback loop while providing some AC gain isolation. Preferably, a processor is used for controlling when the second bank of capacitors gets switched and coupled to the frequency resonant network.

Figure 2:
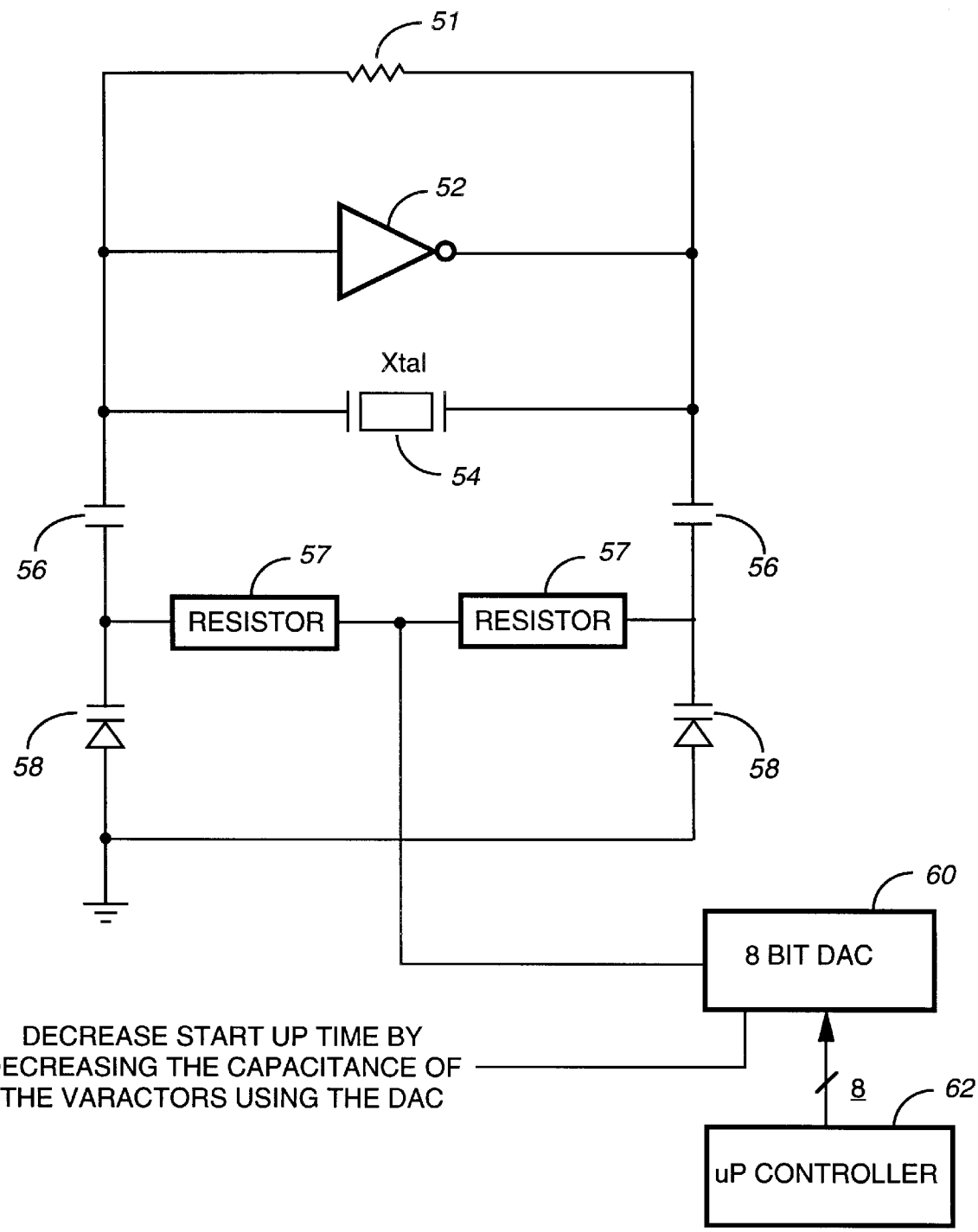
FIG. 2 is another block diagram of an oscillator circuit in accordance with the present invention.

Referring to FIG. 2, oscillator circuit 50 is shown in accordance with the present invention. Preferably, the oscillator circuit 50 comprises an inverting amplifier 52 (or transconductance amplifier) coupled in parallel to a frequency resonant network 54 such as a crystal. Resistor 51 is used to bias up the amplifier and complete the DC feedback loop while providing some AC gain isolation. The oscillator circuit 50 further comprises a first set of capacitors 56 and resistors 57 that provides some isolation for a digital to analog converter (60) and appropriate bias for a pair of varactors 58. The oscillator circuit 50 further comprises at least one varactor 58 preferably controlled to provide a first capacitance load for minimum oscillation and a second capacitance load for start-up. In the disclosed embodiment, a pair of varactors are shown that can be controlled by a microcontroller 62 and a digital to analog converter (DAC) 60 as shown. The microcontroller is preferably a MC68HCll, manufactured by Motorola, Inc. The DAC (60) decreases the start up time by decreasing the capacitance of the varactors. The microcontrolled varactor circuit (62, 60, 57 and 58), thus functionally operates similarly to both the first bank of capacitors 16 coupled to the crystal and the second bank of capacitors switchably coupled in parallel to the crystal as shown in FIG. 1. Thus, a lower capacitance load using the varactors is "switched in" during start up of the oscillator circuit.

Figure 3:
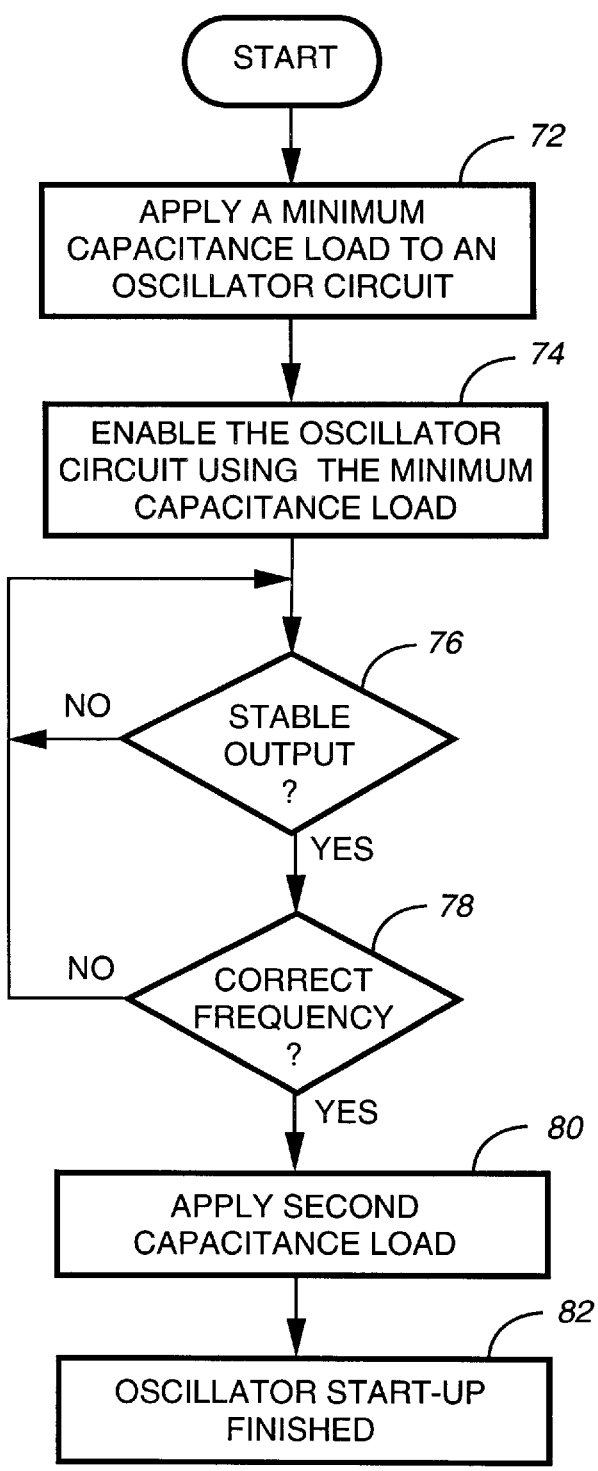
FIG. 3 is a flow chart depicting operation of the oscillator circuit in accordance with the present invention.

Referring to FIG. 3, a flow chart 70 is shown illustrating the method of optimizing an oscillator start up time in accordance with the present invention. Ideally, the method begins by applying a minimum capacitance load to an oscillator circuit at step 72. Then the oscillator circuit is enabled at step 74 using the minimum capacitance load. Next, a stable oscillator output should be sensed at decision block 76 and if the stable oscillation is at a prescribed frequency or first frequency at step 78, then a second capacitance load is applied at step 80 to provide a desired oscillation frequency at step 82 which corresponds to the end of the oscillator start up. As described above, the step of applying the minimum capacitance may involve the step of applying a first bank of capacitors to the oscillator circuit, wherein the first bank of capacitors has a prescribed minimum capacitance and the step of applying the second capacitance load may further comprise the step of applying a second bank of capacitors when the oscillator circuit is resonating at the first frequency with the stable output. Equivalently, the step of applying the first and second capacitance loads could comprise the step of controlling the capacitance of at least one varactor coupled to the oscillator circuit using a processor or microcontroller and optionally a digital to analog converter.

Figure 4:
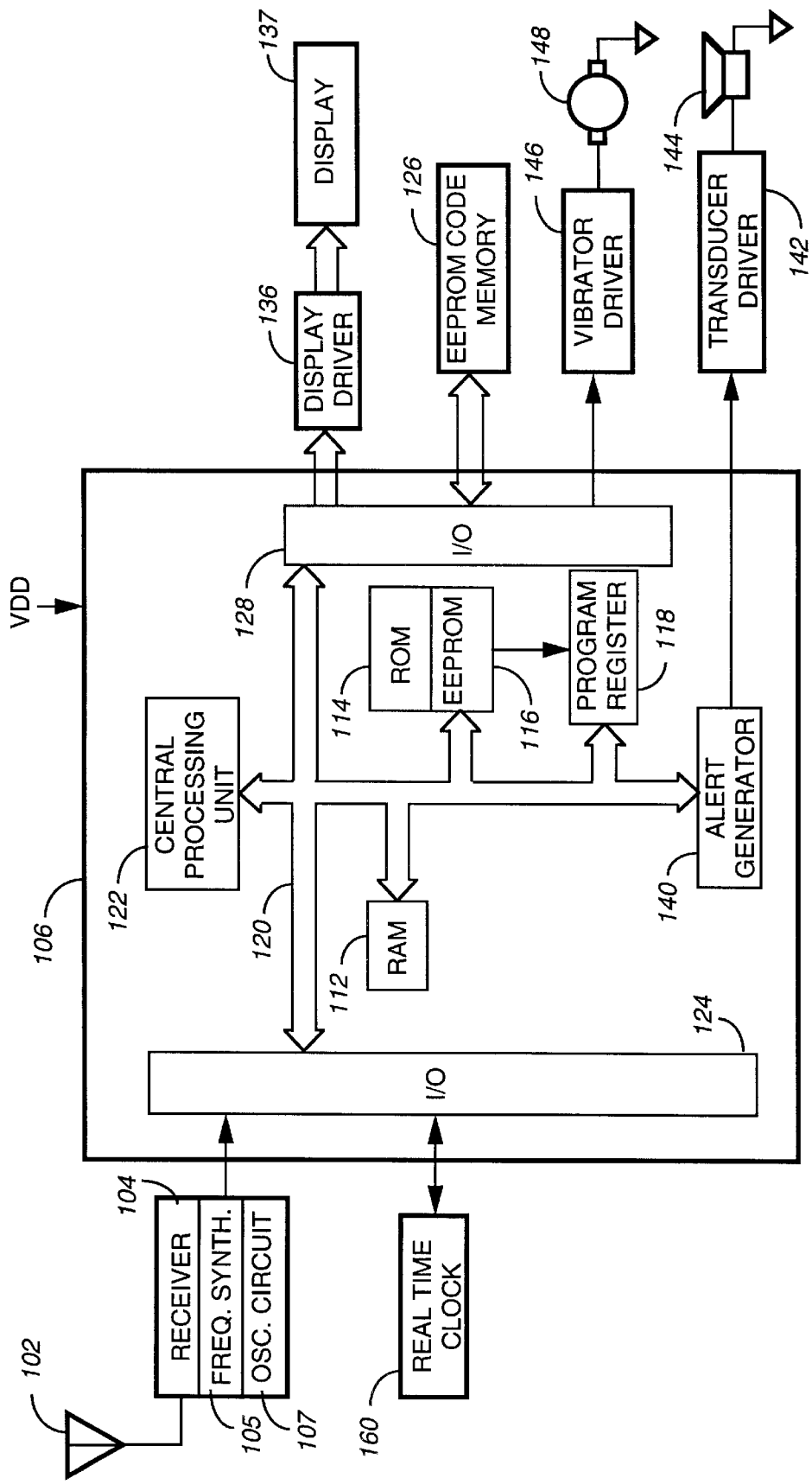
FIG. 4 is a block diagram of a selective call receiver in accordance with the present invention.

FIG. 4 is an electrical block diagram of a selective call device such as a communication receiver 100 in accordance with the present invention. For purposes of description, it will be assumed that one of the well known paging signaling protocols, such as the Golay Sequential Code (GSC) signaling protocol, or the FLEX™ signaling protocol or the POCSAG (Post Office Code Standardization Advisory Group) signaling protocol, are utilized to deliver either voice, tone only, numeric or alphanumeric messages to the communication receiver. When a signaling protocol, such as the FLEX™ signaling protocol is used to encode a message, such as a numeric or alphanumeric message, the message is encoded together with an address identifying the communication receiver to which the message is directed, and then transmitted. The transmitted message is intercepted by an antenna 102 which couples the message to the input of a receiver 104. The receiver 104 processes the message in a manner well known to one of ordinary skill in the art to recover the address and message information. The recovered message information is provided at the output of the receiver 104 as a stream of digital information which is then coupled to the input of a decoder, such as a dedicated hardware decoder, or to a decoder/controller which is microcomputer based. A microcomputer based decoder is shown in FIG. 4 for purposes of description, and is implemented preferably using a microcomputer 106, such as an MC68HC11 microcomputer manufactured by Motorola, Inc. of Schaumburg, Ill. The receiver 104, further preferably comprises a frequency synthesizer 105 and an oscillator circuit 107 similar to the previously described oscillator circuits 10 or 50 of FIG. 1 or 2 respectively. The oscillator circuit 107 preferably serves as the reference signal for the frequency synthesizer 105.

The microcomputer based decoder/controller 106 includes a RAM (random access memory) 112 that is utilized to store variables derived during recovered signal processing, as well as to store information necessary to control the storage of the received message information. A ROM (read only memory) 114 stores at least a part of the receiver control routines which control the operation of the communication receiver. An EEPROM (electrically erasable programmable read only memory) 116 can be used to store additional receiver control routines, in particular those which can be reconfigured by the user. A program register 118 enables the contents of the EEPROM 116 to be selectively reprogrammed, thereby allowing the additional receiver control functions to be changed. The RAM 112, ROM 114, EEPROM 116 and program register 118 couple through the address/data/control bus 120 to a central processing unit (CPU) 122 which executes instructions and controls the operations of the microcomputer 106.

The recovered address and message information is coupled from the output of the receiver 104 into the microcomputer 106 through an input/output (I/O) bus 124. The address information is processed by the CPU 122, and, when the received address is the same as an address stored in a code memory 126 which couples into the microcomputer 106 through I/O bus 128, the message information, if any, is received, demodulated and stored in RAM 112. At the time an address is received, an alert enable signal is generated which can be routed through the data bus 120 to an alert generator 140 that generates an alert signal which is coupled to a transducer driver 142 that processes the alert signal to enable driving an audible alerting device, such as transducer 144. In response to user selection of a switch (not shown), the microcomputer 106 can also generate a tactile alert enable signal which is coupled through data bus 120 and I/O port 128 to a vibrator driver 146 that drives a vibrator 148 to enable generation of a tactile, or more commonly, a silent alert. Recovery of the stored message information can be provided by a switch (not shown) coupled to I/O port 124. The microcomputer 106 recovers the stored message information from RAM 112 and directs the information over the data bus 120 through I/O 128 to a display driver 136 which processes the message information and formats the information for presentation by a display 137, such as an LCD (liquid crystal display).

A real time clock circuit 160, such as an MC68HC68T1 integrated circuit manufactured by Motorola, Inc. of Schaumburg, Ill. couples to the microcomputer 106, such as through I/O port 124, to provide such clock functions as time, date and alarm functions.

It should be understood that the disclosed embodiments are merely examples and the invention is not restricted thereto. It will be understood by those skilled in the art that variations and modifications can be made within the scope and spirit of the present invention as defined by the appended claims.

What is claimed is:

1. A method of optimizing an oscillator start up time, comprising the steps of:

applying a minimum capacitance load to an oscillator circuit;

enabling the oscillator circuit using the minimum capacitance load;

sensing a stable oscillator output at a first frequency; and applying a second capacitance load when the stable oscillator output at the first frequency is sensed to provide a desired oscillation frequency.

2. The method of claim 1, wherein the step of applying the minimum capacitance load further comprises the step of applying a first bank of capacitors to the oscillator circuit, wherein the first bank of capacitors has a prescribed minimum capacitance.

3. The method of claim 1, wherein the step of applying the second capacitance load further comprises the step of applying a second bank of capacitors when the oscillator circuit is resonating at the first frequency with the stable output.

4. The method of claim 1, wherein the step of applying the first capacitance load and the second capacitance load comprises the step of controlling the capacitance of at least one varactor coupled to the oscillator circuit using a digital to analog converter.

5. A method of optimizing an oscillator start up time, wherein an oscillator circuit includes a first bank of capacitors and a second bank of capacitors, the method comprising the steps of:

applying the first bank of capacitors to the oscillator circuit, wherein the first bank of capacitors has a minimum capacitance;

enabling the oscillator circuit using the first bank of capacitors; and applying the second bank of capacitors when the oscillator circuit is resonating at a prescribed frequency with a stable output.

6. The method of claim 5, wherein the step of applying the first capacitance load and the second capacitance load comprises the step of controlling the capacitance of at least one varactor coupled to the oscillator circuit using a digital to analog converter and a microcontroller.

7. An oscillator circuit having an optimized start up time, comprising:

an inverting amplifier coupled in parallel to a frequency resonant network;

a first bank of capacitors coupled to the frequency resonant network;

a second bank of capacitors switchably coupled in parallel to the frequency resonant network, wherein the second bank of capacitors has a higher capacitance load than the first bank of capacitors and wherein a first capacitance load of the first bank of capacitors is used to enable the oscillator circuit at start up time until a stable oscillator output is sensed at a first frequency whereupon the second bank of capacitors is applied to provide a desired oscillation frequency.

8. The oscillator circuit of claim 7, wherein the oscillator circuit further comprises a processor for controlling when the second bank of capacitors gets switched and coupled to the frequency resonant network.

9. The oscillator circuit of claim 8, wherein the processor comprises a microcontroller.

10. The oscillator circuit of claim 8, wherein the second bank of capacitors comprises at least a pair of varactors which are controlled by a digital to analog converter and a microcontroller serving as the processor.

11. The oscillator circuit of claim 7, wherein the frequency resonant network comprises a crystal.

12. The oscillator circuit of claim 7, wherein the frequency resonant network comprises a ceramic resonator.

13. A selective call device, comprising:

a receiver having an oscillator circuit and a decoder; and a processor coupled to the oscillator, wherein the processor is programmed to optimize the start up time of the oscillator circuit by:

applying a minimum capacitance load to the oscillator circuit;

enabling the oscillator circuit using the minimum capacitance load;

sensing a stable output oscillating at a prescribed frequency; and applying a second capacitance load when the stable output oscillating at the prescribed frequency is sensed to provide a desired frequency tuning point.

14. The selective call device of claim 13, wherein the step of applying the minimum capacitance load further comprises the step of applying a first bank of capacitors to the oscillator circuit, wherein the first bank of capacitors has a prescribed minimum capacitance.

15. The selective call device of claim 13, wherein the step of applying the second capacitance load further comprises the step of applying a second bank of capacitors when the oscillator circuit is resonating at the prescribed frequency with the stable output.

16. The selective call device of claim 13, wherein the step of applying the second capacitance load comprises the step of controlling the capacitance of at least one varactor coupled to the oscillator circuit using a digital to analog converter.

17. The selective call device of claim 13, wherein the oscillator circuit further comprises an inverting amplifier coupled in parallel to a frequency resonant network, a first bank of capacitors coupled to the frequency resonant network, and a second bank of capacitors switchably coupled in parallel to the frequency resonant network, wherein the second bank of capacitors has a higher capacitance load than the first bank of capacitors.

18. The selective call device of claim 13, wherein the frequency resonant network comprises a crystal.

* * * * *